United States Patent
Chen et al.

(10) Patent No.: US 10,418,253 B2
(45) Date of Patent: Sep. 17, 2019

(54) METHOD FOR MAKING NANOSTRUCTURES

(71) Applicants: Tsinghua University, Beijing (CN); HON HAI PRECISION INDUSTRY CO., LTD., New Taipei (TW)

(72) Inventors: Mo Chen, Beijing (CN); Li-Hui Zhang, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/008,216

(22) Filed: Jun. 14, 2018

(65) Prior Publication Data

US 2018/0374711 A1 Dec. 27, 2018

(30) Foreign Application Priority Data

Jun. 21, 2017 (CN) .......................... 2017 1 0476065

(51) Int. Cl.
| | |
|---|---|
| *H01L 21/308* | (2006.01) |
| *H01L 29/66* | (2006.01) |
| *H01L 21/311* | (2006.01) |
| *H01L 29/417* | (2006.01) |

(Continued)

(52) U.S. Cl.
CPC ...... *H01L 21/3086* (2013.01); *H01L 21/3088* (2013.01); *H01L 21/31116* (2013.01); *H01L 27/1288* (2013.01); *H01L 29/41733* (2013.01); *H01L 29/66742* (2013.01); *H01L 29/78654* (2013.01); *H01L 29/78681* (2013.01); *H01L 29/78684* (2013.01)

(58) Field of Classification Search
None
See application file for complete search history.

(56) References Cited

U.S. PATENT DOCUMENTS

| | | | |
|---|---|---|---|
| 8,709,267 B2* | 4/2014 | Yu | G03F 7/0035 204/192.11 |
| 2004/0029050 A1* | 2/2004 | Brenner | B82Y 10/00 430/312 |
| 2008/0254632 A1* | 10/2008 | Chen | H01L 21/0272 438/701 |

* cited by examiner

*Primary Examiner* — Bradley Smith
(74) *Attorney, Agent, or Firm* — ScienBiziP, P.C.

(57) ABSTRACT

A method of making nanostructures including: locating a photoresist mask layer on a substrate, the thickness of the photoresist mask layer is H; forming a patterned mask layer includes a plurality of stripe masks, a spacing distance between adjacent stripe masks equals L; depositing a first thin film layer along a first direction, the thickness of the first thin film layer is D, a first angle between the first direction and a direction along the thickness of stripe masks is $\theta_1$, $\theta_1 < \tan^{-1}(L/H)$; depositing a second thin film layer along a second direction, a second angle between the second direction and the direction along the thickness of stripe masks is $\theta_2$, $\theta_2 < \tan^{-1}[L/(H+D)]$, $0 < L - H \tan\theta_1 - (H+D)\tan\theta_2 < 10$ nm, the first thin film layer partly overlaps with the second thin film layer to form an overlapping structure; etching the first thin film layer and the second thin film layer to obtain a nanoscale microstructure.

14 Claims, 8 Drawing Sheets

(51) Int. Cl.
*H01L 29/786* (2006.01)
*H01L 27/12* (2006.01)

METHOD FOR MAKING NANOSTRUCTURES

CROSS-REFERENCE TO RELATED APPLICATIONS

This application is related to applications entitled, "METHOD FOR MAKING NANOSCALE CHANNELS", Ser. No. 16/008,211 filed Jun. 14, 2018, "METHOD FOR MAKING THIN FILM TRANSISTOR", Ser. No. 16/008,220 filed Jun. 14, 2018, and "METHOD FOR MAKING NANOSCALE BELTS", Ser. No. 16/008,205 filed Jun. 14, 2018.

FIELD

The subject matter herein generally relates to a method for making nanostructures.

BACKGROUND

Currently, when preparing nanostructures, the minimum processing size of the nanostructures is mainly determined by the performance of the processing devices. For certain dimensions, especially those less than about 10 nanometers, the majority of processing devices have difficulty not only preparing the nanostructures, but also forms controlling costs, consistencies, yields, and other processing parameters.

Methods for making less than about 10 nanometers structures include evaporation stripping method and etching method. These methods require small-sized patterned photoresist layers used as a mask to prepare small dimension structures such as fine groove structures. However, it is difficult to create the small-sized photoresist layers. If the photoresist layer is too thick, it is difficult to stand up and easy to collapse. If the photoresist layer is too thin, it is difficult to transfer the photoresist layer. Also when the photoresist is removed by peeling or etching, the photoresist has a small amount of residue which cause the small dimension structures to be inaccurate.

Thus, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will be described, by way of example only, with reference to the attached figures

DETAILED DESCRIPTION

Figure 1:
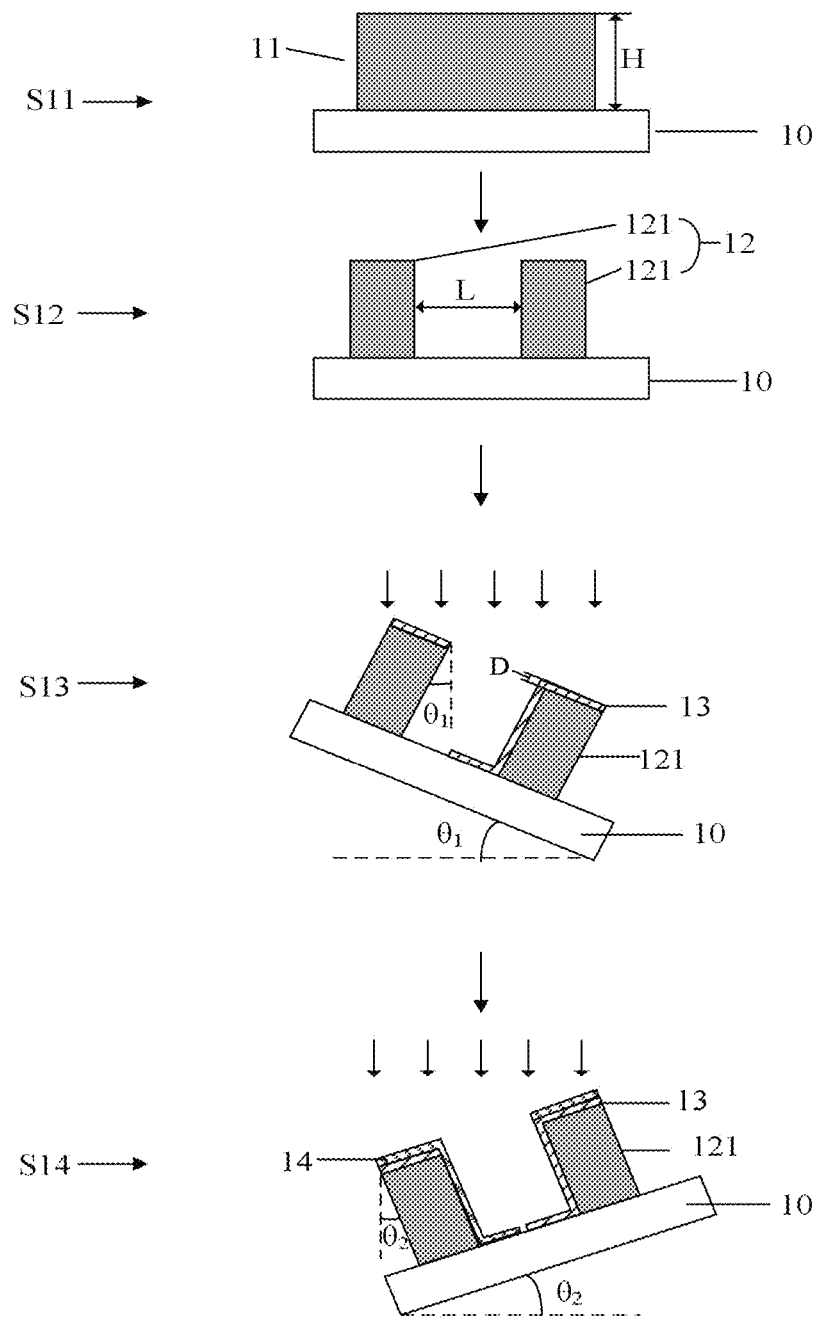
FIG. 1 is a flow chart of an embodiment of a method for making nanoscale channels.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape, or other feature that the term modifies, such that the component need not be exact. The term "comprising" means "including, but not necessarily limited to"; it specifically indicates open-ended inclusion or membership in a so-described combination, group, series, and the like. It should be noted that references to "an" or "one" embodiment in this disclosure are not necessarily to the same embodiment, and such references mean "at least one."

Figure 2:
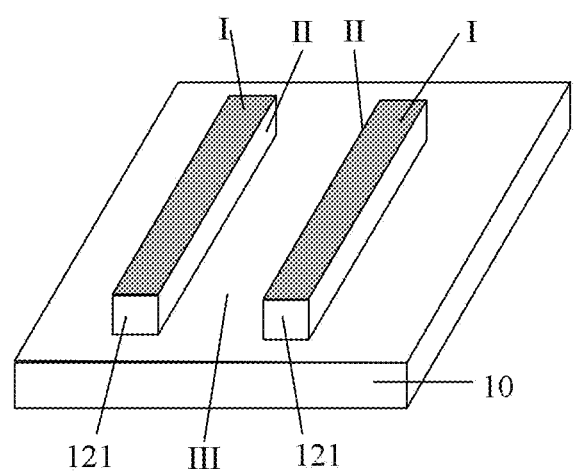
FIG. 2 is a schematic view of an embodiment of a strip mask after development.

In FIG. 1 and FIG. 2, an embodiment of a method of making nanoscale channels may comprise at least the following steps:

S11, providing a substrate 10, locating a photoresist mask layer 11 on the substrate, the thickness of the photoresist mask layer 11 equals H;

S12, forming a patterned mask layer 12 by exposing and developing the photoresist mask layer 11, the patterned mask layer 12 comprises a plurality of parallel and spaced stripe masks 121, the spacing between adjacent stripe masks 121 equals L, a top surface of the patterned mask layer 12 the substrate 10 defines a first area I, a side surface of the patterned mask layer 12 defines a second area II, a surface of the substrate 10 exposed between adjacent stripe masks 121 defines a third area III;

S13, rotating the substrate 10 with an extending direction of the stripe masks 121 as a rotation axis, a first angle between the substrate 10 and the horizontal direction equals $\theta_1$, $\theta_1 < \tan^{-1}(L/H)$, depositing a first thin film layer 13 on the substrate 10 in a vertical direction, the thickness of the first thin film layer 13 equals D;

S14, rotating the substrate 10 back to the horizontal direction, continuing to rotate the substrate 10 to obtain a second angle, the second angle between the substrate 10 and the horizontal direction equals $\theta_2$, $\theta_2 < \tan^{-1}[L/(H+D)]$, depositing a second thin film layer 14 on the substrate 10 in the vertical direction, $0 < H \tan \theta_1 + (H+D)\tan \theta_2 - L < 10$ nm, an interval area between the first thin film layer 13 and the second thin film layer 14 in the third area III is a nanoscale channel.

In step S11, the material of the substrate 10 can be insulating materials such as silica or silicon nitride. The material of the substrate 10 can also be conductive materials such as gold, aluminum, nickel, chromium, or copper. Also the material of the substrate 10 can be semiconductor materials such as silicon, gallium nitride, or gallium arsenide. In one embodiment, the material of the substrate 10 is a silicon wafer.

The photoresist mask layer 11 plays a role in shielding. The material of the photoresist mask layer 11 is photoresist. The type of the photoresist mask layer 11 can be negative or positive. The photoresist mask layer 11 can be electron beam photoresist or ultraviolet photoresist, such as S9912, SU8, poly methyl methacrylate (PMMA), ZEP, hydrogen silsesquioxane (HSQ). The photoresist mask layer 11 can be directly coated on the substrate 10 by spin coating. The thickness of H can be adjusted according to need. The thickness of H is in a range of 200 nanometers to 400 nanometers. The thickness of H can be in a range of 300 nanometers to 400 nanometers. In one embodiment, the material of the photoresist mask layer 11 is HSQ, and the thickness of H is 400 nanometers.

In step S12, the photoresist mask layer 11 is exposed by using a pattern as an exposure pattern. The shape and size of the pattern can be set according to need. The exposure intensity and exposure time can be adjusted according to the thickness and material of the photoresist mask layer 11. In one embodiment, the photoresist mask layer 11 is exposed by electron beam. After exposed, the photoresist mask layer 11 is placed into a developer to obtain the patterned mask layer 12. The exposed part of the photoresist mask layer 11 is removed by the developer. The first area I is the top surface of the patterned mask layer 12, and the first area I is also the top surface of the stripe masks 121. The second area II is the side surface of the patterned mask layer 12, and the side surface is perpendicular to the substrate 10. The second area II is produced after removing the exposed photoresist. The third area III is the exposed surface of the substrate 10 between adjacent stripe masks 121. The third area III is produced after removing the exposed photoresist to expose a portion of the substrate 10. In one embodiment, the developer is tetramethylammonium hydroxide(TMAH) solution, and the developing time is 90s. The plurality of stripe masks 121 can be arranged in a row, or can also be arranged in multiple rows. The spacing of adjacent stripe masks 121 in each row equals L. The spacing of L is in a range of 200 nanometers to 1000 nanometers. The spacing of L can also be in a range of 400 nanometers to 500 nanometers. In one embodiment, the spacing of L is 400 nanometers.

In step S13, the plurality of stripe masks 121 extend in the same direction. The extending direction of stripe masks 121 forms the rotation axis to rotate the substrate 10. Before rotating the substrate 10, the substrate 10 is placed horizontally. After rotating the substrate 10, the first angle between the substrate 10 and the horizontal direction is $\theta_1$, and $\theta_1 < \tan^{-1}(L/H)$. A thickness direction of the stripe masks 121 is perpendicular to the surface of the substrate 10, and a direction of depositing the first thin film layer 13 is the vertical direction, so the angle between the thickness direction of the stripe masks 121 and the direction of depositing the first thin film layer 13 is also $\theta_1$. The range of $\theta_1$ is $\theta_1 < 45$ degrees. In one embodiment, the angle $\theta_1$ is 30 degrees. When depositing the first thin film layer 13 in the vertical direction, the first thin film layer 13 can not cover the entire surface of the substrate 10 and the entire surface of the stripe masks 121. A part surface of the substrate 10 and a part surface of the stripe masks 121 can not be deposited by the first thin film layer 13 due to the obstruction of the stripe masks 121. The position of the surface of the substrate 10 without the first thin film layer 13 can be adjusted by adjust the first angle $\theta_1$, the thickness of the stripe masks 121, or the spacing L.

The material of the first thin film layer 13 can be metal materials such as gold, nickel, titanium, iron, aluminum. The material of the first thin film layer 13 can also be nonmetallic materials such as alumina, magnesium oxide, zinc oxide, hafnium oxide, and silica. The material of the first thin film layer 13 is not limited to the above as long as the material used can be formed into a film. The first thin film layer 13 can be deposited by magnetron sputtering, electron beam evaporation, or the like. The thickness of D is less than 40 nanometers. In one embodiment, the first thin film layer 13 is formed by electron beam evaporation, the material of the first thin film layer 13 is aluminum, and the thickness of D is 30 nanometers.

Figure 3:
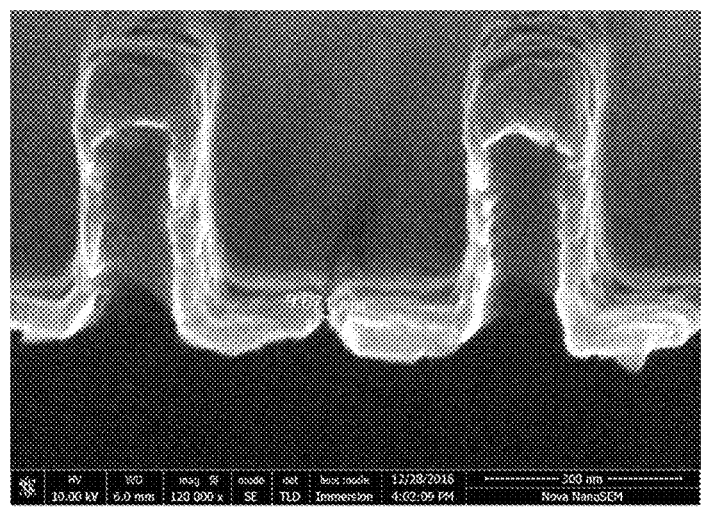
FIG. 3 is a Scanning Electron Microscope (SEM) image of nanoscale channels.

In step S14, the substrate 10 is rotated back to the horizontal direction by selecting a clockwise or counterclockwise rotation according to need. After the substrate 10 being rotated back to the horizontal direction, the substrate 10 continues to be rotated to obtain the second angle $\theta_2$ between the substrate 10 and the horizontal direction, $\theta_2 < \tan^{-1}[L/(H+D)]$. Similarly, the angle between the thickness direction of the stripe masks 121 and the direction of depositing the second thin film layer 14 is also $\theta_2$. The range of $\theta_2$ is $\theta_2 < 45$ degrees. In one embodiment, the angle $\theta_2$ is 30 degrees. When depositing the second thin film layer 14 in the vertical direction, the second thin film layer 14 can not cover the entire surface of the substrate 10 and the entire surface of the stripe masks 121. A partial surface of the substrate 10 and a partial surface of the stripe masks 121 can not be deposited by the second thin film layer 14 due to the obstruction of the stripe masks 121. When depositing the first thin film layer 13 and the second thin film layer 14, the parameters H, $\theta_1$, $\theta_2$, D, and L should satisfy $0 < H \tan \theta_1 + (H+D) \tan \theta_2 - L < 10$ nm, so that the first thin film layer 13 and the second thin film layer 14 are spaced from each other on the substrate 10, and the spacing is in a nanometer range. The spacing is less than 20 nanometers. The spacing can be less than 10 nanometers. In one embodiment, the spacing is 9.67 nanometers. This is shown in FIG. 3 an SEM image showing nanoscale channels.

The material of the second thin film layer 14 can be metal materials such as gold, nickel, titanium, iron, aluminum. The material of the second thin film layer 14 can also be nonmetallic materials such as alumina, magnesium oxide, zinc oxide, hafnium oxide, and silica. The material of the second thin film layer 14 is not limited to the above as long as the material used can be formed into a film. The material of the second thin film layer 14 and the material of the first thin film layer 13 can be the same or different. The second thin film layer 14 can be deposited by magnetron sputtering, electron beam evaporation, or the like. The thickness of the second thin film layer 14 can be adjusted according to need. In one embodiment, the second thin film layer 14 is formed by electron beam evaporation, the material of the second thin film layer 14 is aluminum, and the thickness of the second thin film layer 14 is 30 nanometers.

Figure 4:
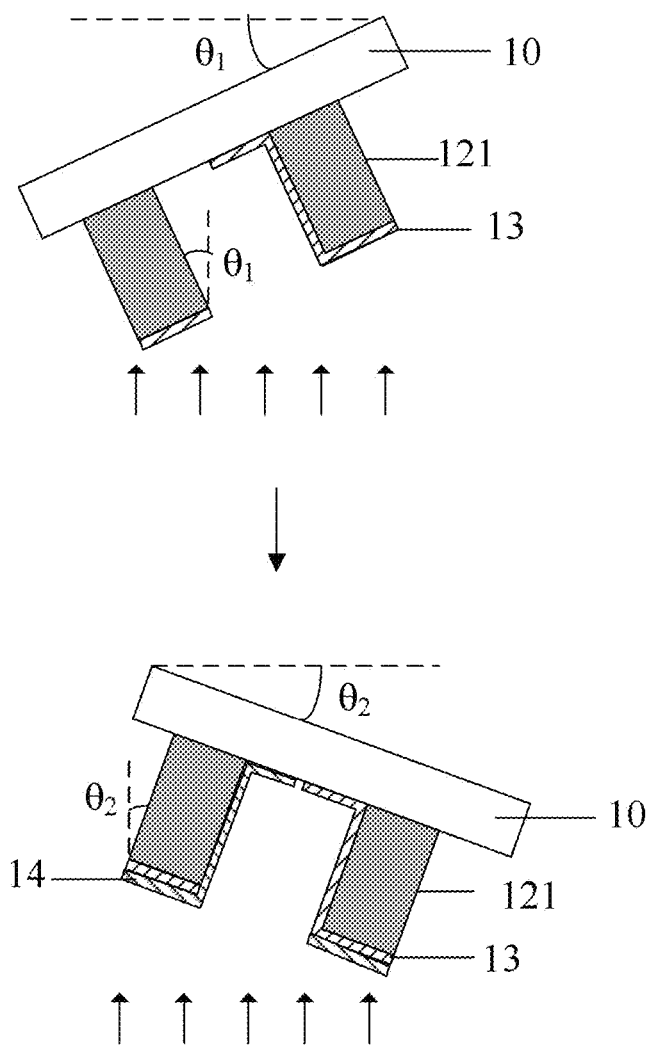
FIG. 4 is a flow chart of an embodiment of a method for depositing a first film layer and a second film layer.

In the vertical deposition process, the first thin film layer 13 and the second thin film layer 14 can be deposited downwardly as in FIG. 1, and the first thin film layer 13 and the second thin film layer 14 can also be deposited upwardly as in FIG. 4. When the surface of the substrate having the stripe masks 121 is inverted to be downward, the first thin film layer 13 and the second thin film layer 14 are deposited on the substrate 10 and the stripe masks 121 upwardly.

Figure 5:
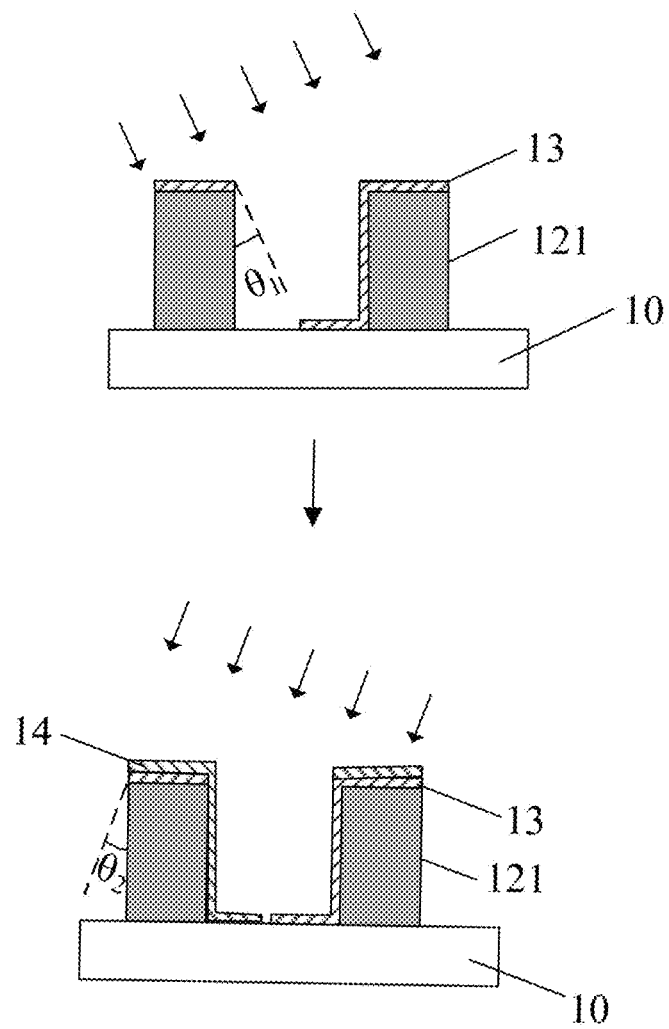
FIG. 5 is a flow chart of an embodiment of a method for depositing a first film layer and a second film layer.

The method of depositing the first thin film layer 13 and the second thin film layer 14 is not limited above as long as the parameters H, $\theta_1$, $\theta_2$, D, and L satisfy $0<H \tan \theta_1 +(H+D)\tan \theta_2 -L<10$ nm. The deposition direction should be adjusted in a plane perpendicular to the extending direction of the stripe masks 121. Referring to FIG. 5, when the substrate 10 is fixed horizontally, the first thin film layer 13 and the second thin film layer 14 can be deposited by adjusting the angle between the deposition direction and the thickness direction of the stripe masks 121.

The advantages of the method of making nanoscale channels are described below. The nanoscale channels can be formed by a lateral deposition method. In the deposition process, the nanoscale channels can be formed by adjusting the parameters of deposition without etching and stripping. The substrate can not be damaged. The position of the nanoscale channels can be controlled precisely by the lateral deposition method, and the nanoscale channels can be prepared at any position. The width of the nanoscale channels can be adjusted according to need. A material deposited on one side of the nanoscale channel can be different from the material deposited on the other side of the nanoscale channel.

Figure 6:
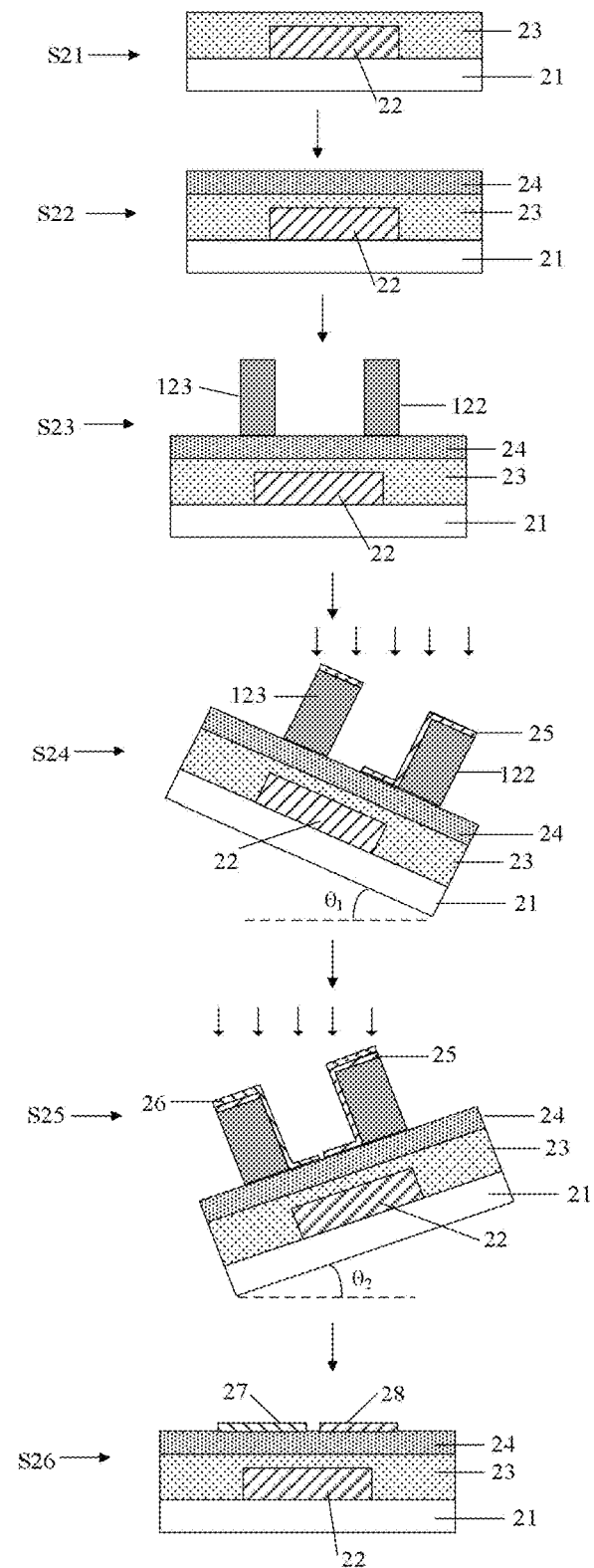
FIG. 6 is a flow chart of an embodiment of a method for making a thin film transistor with nanoscale channels.

Referring to FIG. 6, an embodiment of a method of making a thin film transistor 20 with nanoscale channels comprises:

S21, providing a gate electrode 22 on a substrate 21, forming a gate insulating layer 23 on a surface of the gate electrode 22;

S22, locating a semiconductor layer 24 on the gate insulating layer 23;

S23, placing a first stripe mask 122 and a second stripe mask 123 on the semiconductor layer 24, wherein the first stripe mask 122 and the second stripe mask 123 are parallel and spaced from each other, the thickness of the first stripe mask 122 and the thickness of the second stripe mask 123 are both set to H, the spacing between the first stripe mask 122 and the second stripe mask 123 equals L;

S24, rotating the semiconductor layer 24 with an extending direction of the first stripe mask 122 as a rotation axis, a first angle between the semiconductor layer 24 and the horizontal direction equals $\theta_1$, $\theta_1 < \tan^{-1}(L/H)$, depositing a first conductive film layer 25 on the semiconductor layer 24 in the vertical direction, the thickness of the first conductive film layer 25 equals D;

S25, rotating the semiconductor layer 24 back to the horizontal direction, continuing to rotate the semiconductor layer 24 to obtain a second angle, the second angle between the semiconductor layer 24 and the horizontal direction equals $\theta_2$, $\theta_2 < \tan^{-1}[L/(H+D)]$, depositing a second conductive film layer 26 on the semiconductor layer 24 in the vertical direction, $0<H \tan \theta_1 +(H+D)\tan \theta_2 -L<10$ nm, an interval area between the first conductive film layer 25 and the second conductive film layer 26 is a nanoscale channel, the first conductive film layer 25 forms a source electrode 27, and the second conductive film layer 26 forms a drain electrode 28.

In step S21, the material of the gate electrode 22 is a conductive material. The conductive material can be metal, indium tin oxide, arsenic trioxide, conductive silver glue, conductive polymers, or conductive carbon nanotubes. The metal materials can be aluminum, copper, tungsten, molybdenum, gold, titanium, palladium or any combination of alloys.

The material of the gate insulating layer 23 can be hard materials such as alumina, hafnium oxide, silicon nitride, or silicon oxide. The material of the gate insulating layer 23 can also be flexible materials such as benzocyclobutene (BCB), polyester, or acrylic resin.

The gate insulating layer 23 can be deposited on the gate electrode 22 by a magnetron sputtering method or a electron beam deposition method. In one embodiment, the gate insulating layer 23 is deposited by electron beam deposition, and the material of the gate insulating layer 23 is alumina.

In step S22, the material of the semiconductor layer 24 can be gallium arsenide, gallium phosphide, gallium nitride, silicon carbide, germanium silicide, silicon, germanium, carbon nanotubes, graphene, or molybdenum sulfide. The method of forming the semiconductor layer 24 can be tiling method, epitaxial growth method, or vapor deposition method. When the semiconductor layer 24 is a carbon nanotube layer, a graphene layer or a molybdenum sulfide layer, the semiconductor layer 24 can be transferred to the gate insulating layer 23 by a photoresist layer. The thickness of the semiconductor layer 24 can be adjusted according to need. The thickness of the semiconductor layer 24 should be less than 10 nanometers. In one embodiment, the thickness of the semiconductor layer 24 is 2 nanometers.

In steps S23 to S25, the method of making nanoscale channels is similar to the method of making nanoscale channels of FIG. 1 except that a first conductive film layer 25 and a second conductive film layer 26 are directly deposited on the semiconductor layer 24 to form a thin film transistor having a nanoscale channel. The first area I is the top surfaces of the first stripe mask 122 and the second stripe mask 123. The second area II is the side surfaces of the first stripe mask 122 and the second stripe mask 123, and the side surfaces are perpendicular to the semiconductor layer 24. The third area III is the exposed surface of the semiconductor layer 24 between the first stripe mask 122 and the second stripe mask 123. The material of the first conductive film layer 25 can be aluminum, nickel, gold, titanium, iron. The material of the second conductive film layer 26 can be aluminum, nickel, gold, titanium, iron. The first conductive film layer 25 located on the semiconductor layer 24 forms the source electrode 27, and the second conductive film layer 26 located on the semiconductor layer 24 forms the drain electrode 28.

Furthermore, the source electrode 27 and the drain electrode 28 can also be formed before making the gate electrode 22. Thus, a top gate type thin film transistor can be formed.

The method of making the thin film transistor 20 further includes a step of removing the first stripe mask 122 and the second stripe mask 123. The first stripe mask 122 and the second stripe mask 123 can be removed by chemical reagent. For example, the structure obtained in step S25 can be placed in an acetone solution to remove the first stripe mask 122 and the second stripe mask 123. When the first conductive film layer 25 and the second conductive film layer 26 are not free-standing structures, the first conductive film layer 25 located on the first area I and the second area II can be removed due to loss of support, and the second conductive film layer 26 located on the first area I and the second area II can also be removed due to loss of support. After removing the first stripe mask 122 and the second stripe mask 123, the first conductive film layer 25 located on the semiconductor layer 24 forms the source electrode 27, and the second conductive film layer 26 located on the semiconductor layer 24 forms the drain electrode 28. When the first conductive film layer 25 and the second conductive film layer 26 are free-standing structures, the first conductive film layer 25 located on the first area I and the second area II can be removed by dry etching, and the second conductive film layer 26 located on the first area I and the second area II can also be removed by dry etching. The term "free-standing structure" means that the structure can sustain the weight of itself when hoisted by a portion thereof without any significant damage to its structural integrity.

Figure 7:
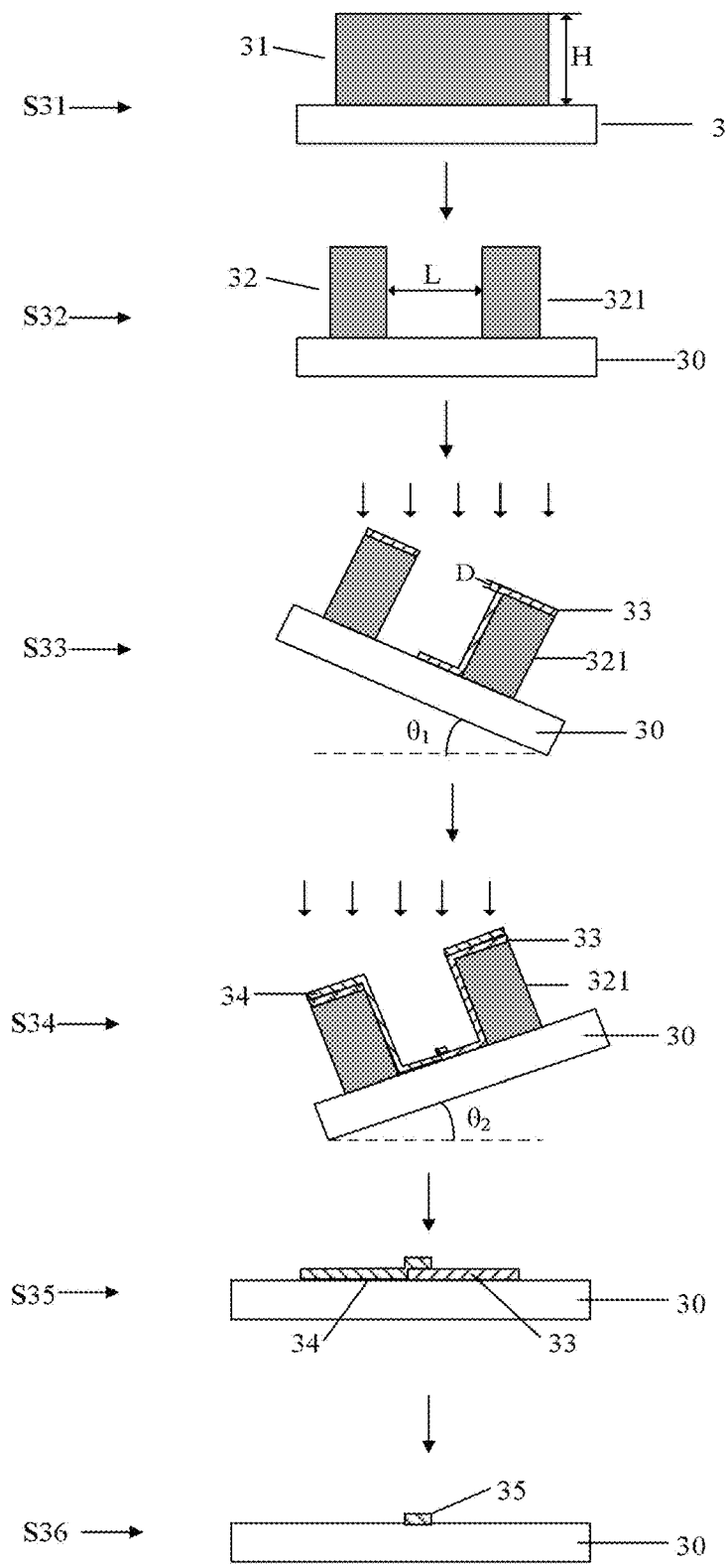
FIG. 7 is a flow chart of an embodiment of a method for making nanostructures.

Referring to FIG. 7, an embodiment of a method of making nanoscale microstructure comprises:

S31, providing a substrate 30, locating a photoresist mask layer 31 on the substrate, the thickness of the photoresist mask layer 31 equals H;

S32, forming a patterned mask layer 32 by exposing and developing the photoresist mask layer 31, the patterned mask layer 32 comprises a plurality of parallel and spaced stripe masks 321, the spacing between adjacent stripe masks 321 equals L, a top surface of the patterned mask layer 32 defines a first area I, a side surface of the patterned mask layer 32 defines a second area II, a surface of the substrate 30 exposed between adjacent stripe masks 321 defines a third area III;

S33, rotating the substrate 30 with an extending direction of the stripe masks 321 as a rotation axis, a first angle between the substrate 30 and the horizontal direction equals $\theta_1$, $\theta_1 < \tan^{-1}$ (L/H), depositing a first thin film layer 33 on the substrate 30 in the vertical direction, the thickness of the first thin film layer 33 equals D;

S34, rotating the substrate 30 back to the horizontal direction, continuing to rotate the substrate 30 to obtain a second angle, the second angle between the substrate 30 and the horizontal direction equals $\theta_2$, $\theta_2 < \tan^{-1}[L/(H+D)]$, depositing a second thin film layer 34 on the substrate 30 in the vertical direction, $0 < L - H \tan\theta_1 - (H+D)\tan\theta_2 < 10$ nm, the first thin film layer 33 partially overlaps with the second thin film layer 34 to form an overlapping structure and a non-overlapping structure;

S35, removing the plurality of stripe masks 321;

S36, dry etching the first thin film layer 33 and the second thin film layer 34 to obtain a nanoscale microstructure 35, wherein the width of the nanoscale microstructure 35 equals the width of the overlapping structure, and the non-overlapping structure is etched away.

The steps S31-S33 are the same as the steps S11-S13 of FIG. 1, the stripe masks 321 can be formed on the substrate 30, and the first thin film layer 33 can be deposited on the substrate 30 and the stripe masks 321.

In step S34, the method of depositing the second thin film layer 34 is similar to the method of depositing the second thin film layer 14 except that the second thin film layer 34 partially overlaps the first thin film layer 33. The width of the overlapping structure is in the nanometer scale. When depositing the first thin film layer 33 and the second thin film layer 34, the parameters H, $\theta_1$, $\theta_2$, D, and L should satisfy $0 < L - H \tan\theta_1 - (H+D)\tan\theta_2 < 10$ nm, so that the second thin film layer 34 partially overlaps the first thin film layer 33 on the substrate 30, and the width of the overlapping structure is in the nanometer scale.

In step S35, the stripe masks 321 can be removed by chemical reagent. For example, the structure formed in step S34 can be placed in an acetone solution to remove the stripe masks 321. When the first film layer 33 and the second film layer 34 are not free-standing structures, the first film layer 33 located on the first area I and the second area II can be removed due to loss of support, and the second film layer 34 located on the first area I and the second area II can also be removed due to loss of support. Thus, only the first film layer 33 and the second film layer 34 located on the third area III are retained. When the first film layer 33 and the second film layer 34 are free-standing structures, the first film layer 33 located on the first area I, the second area II and the third area III are all remained, and the second film layer 34 located on the first area I, the second area II and the third area III all remain. The term "free-standing structure" means that the structure can sustain the weight of itself when hoisted by a portion thereof without any significant damage to its structural integrity.

In step S36, the dry etching can be plasma etching or reactive ion etching (RIE). In one embodiment, the dry etching is performed by applying plasma energy on the entire or partial surface of the first film layer 33 and the second film layer 34 via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

When the first film layer 33 and the second film layer 34 are still integrated structures after removing the stripe masks 321, the first film layer 33 located on the first area I and the second area II can be removed by dry etching, and the second film layer 34 located on the first area I and the second area II can also be removed by dry etching. When dry etching the first thin film layer 33 and the second thin film layer 34 located on the third area III, the first thin film layer 33 and the second thin film layer 34 are etched at the same time. Since the thickness of the overlapping structure is greater than the thickness of the first thin film layer 33, and is greater than the thickness of the second thin film layer 34, and the etching rate of the first thin film layer 33 is the same as the etching rate of the second thin film layer 34, the overlapping structure still remains after the non-overlapping structure of the first thin film layer 33 and the second thin film layer 34 being etched away. The overlapping structure remained is the nanoscale microstructure. Thus, the width of the nanoscale microstructure is the same as the width of the overlapping structure. In the process of etching, no mask is provided to make the nanoscale microstructure.

Furthermore, the first thin film layer 33 and the second thin film layer 34 can be etched before removing the stripe masks 321. the first thin film layer 33 and the second thin film layer 34 located on the first area I can be etched firstly, then the first thin film layer 33 and the second thin film layer 34 located on the second area II and the third area III continue to be etched.

The advantages of the method of making nanostructures according to the processes described herein are described below. The nanostructures can be formed by a lateral deposition method. During the deposition process, the nanostructures can be formed by adjusting the deposition parameters. The nanostructure positioning can be controlled precisely by the lateral deposition method, and the nanostructures can be prepared at any position. The width of the nanostructures can be adjusted according to need.

Figure 8:
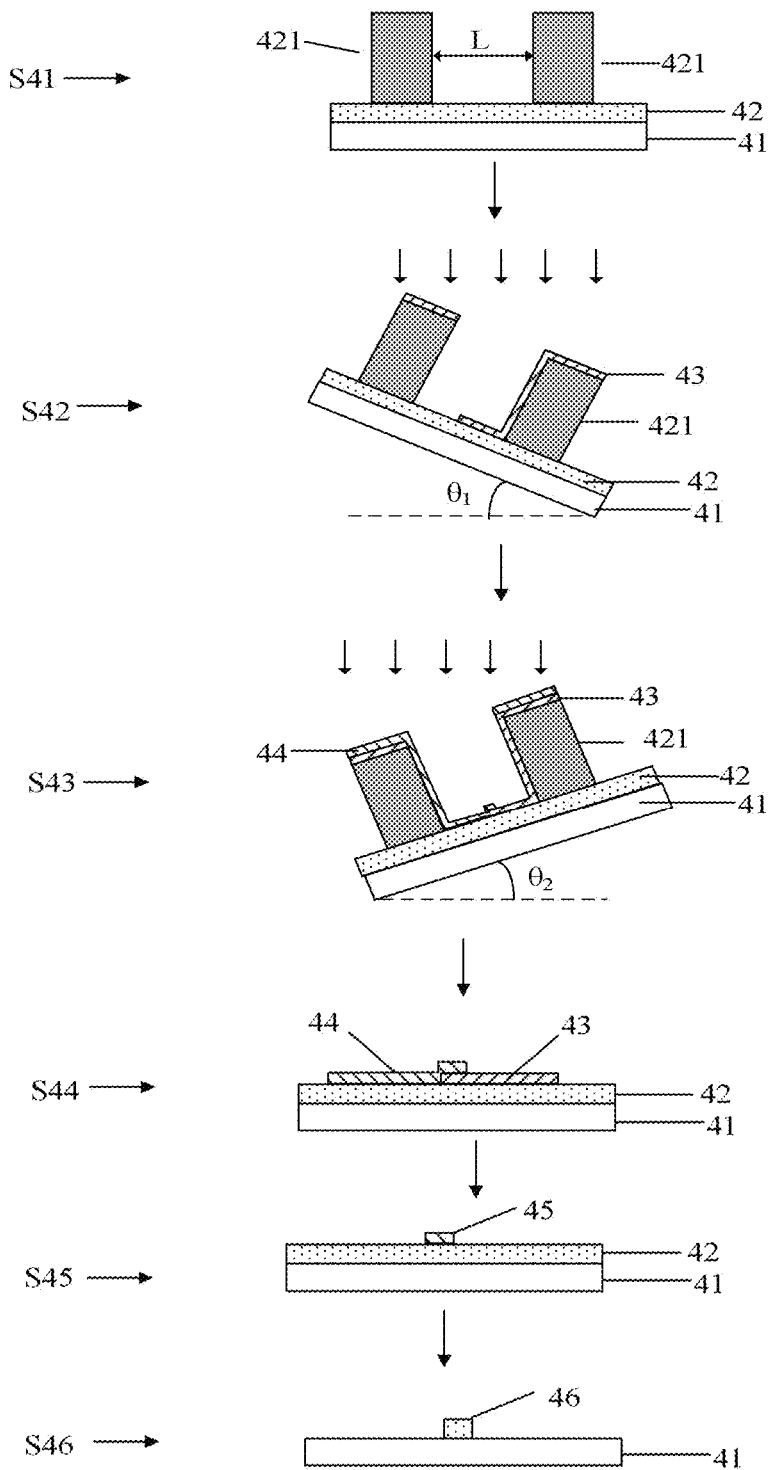
FIG. 8 is a flow chart of an embodiment of a method for making nanoscale belts.

Referring to FIG. 8, an embodiment of a method of making nanoscale belts comprises:

S41, providing a semiconductor thin film 42 on a substrate 41, placing a plurality of parallel and spaced stripe masks 421 on the semiconductor thin film 42, wherein the thickness of the stripe masks 421 equals H, the spacing between adjacent stripe masks 421 equals L;

S42, rotating the semiconductor thin film 42 with an extending direction of the stripe masks 421 as a rotation axis, a first angle between the semiconductor thin film 42 and the horizontal direction equals $\theta_1$, $\theta_1 < \tan^{-1}(L/H)$, depositing a first thin film layer 43 on the semiconductor thin film 42 in the vertical direction, the thickness of the first thin film layer 43 equals D;

S43, rotating the semiconductor thin film 42 back to the horizontal direction, continuing to rotate the semiconductor thin film 42 to obtain a second angle, the second angle between the semiconductor thin film 42 and the horizontal direction equals $\theta_2$, $\theta_2 < \tan^{-1}[L/(H+D)]$, depositing a second thin film layer 44 on the semiconductor thin film 42 in the vertical direction, $0 < L - H \tan\theta_1 - (H+D)\tan\theta_2 < 10$ nm, the first thin film layer 43 partially overlaps with the second thin film layer 44 to form an overlapping structure and a non-overlapping structure;

S44, removing the plurality of stripe masks 421;

S45, dry etching the first thin film layer 43 and the second thin film layer 44 to obtain a nanostructure 45;

S46, etching the semiconductor thin film 42 using the nanostructure 45 as a mask to obtain a nanoscale belt 46.

In step S41, the material of the semiconductor thin film 42 is a two-dimensional material such as graphene, molybdenum sulfide and the like. The semiconductor thin film 42 are formed on the substrate 41 by tiling method, vapor deposition. The thickness of the semiconductor thin film 42 can be adjusted according to need. In one embodiment, the material of the semiconductor thin film 42 is graphene.

The steps S42-S45 are the same as the steps S33-S36 of FIG. 7. The nanostructure 45 can be used as the mask to make the nanoscale belt 46.

A first area I is the top surfaces of the stripe masks 421. The second area II is the side surfaces of the stripe masks 421, and the side surfaces are perpendicular to the semiconductor thin film 42. The third area III is the exposed surface of the semiconductor thin film 42 between the adjacent stripe masks 421.

In step S46, the semiconductor thin film 42 includes a covered portion and a non-covered portion, the covered portion is covered by the nanostructure 45. when the non-covered portion of the semiconductor thin film 42 is etched, the nanostructure can further be etched. Since the nanostructure 45 forms the mask, so the nanostructure 45 should not be completely etched away before the non-covered portion of the semiconductor thin film 42 being etched away.

After etching away the non-covered portion of the semiconductor thin film 42, the nanostructure 45 is not completely etched away. Thus, the nanostructure 45 remained can further be removed by wet etching. In one embodiment, the nanostructure 45 remained is removed by hydrochloric acid solution.

The embodiments shown and described above are only examples. Even though numerous characteristics and advantages of the present technology have been set forth in the foregoing description, together with details of the structure and function of the present disclosure, the disclosure is illustrative only, and changes may be formed in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A method of making nanostructures, comprising:

locating a photoresist mask layer on a substrate, wherein a first thickness of the photoresist mask layer equals H;

forming a patterned mask layer by exposing and developing the photoresist mask layer, wherein the patterned mask layer comprises a plurality of parallel and spaced stripe-shaped shield, a spacing distance between adjacent stripe-shaped shield equals L, a top surface of the patterned mask layer away from the substrate defines a first area I, a side surface of the patterned mask layer defines a second area II, a surface of the substrate exposed between adjacent stripe-shaped shield defines a third area III;

depositing a first thin film layer on the substrate along a first direction, a second thickness of the first thin film layer equals D, a first angle between the first direction and a thickness direction of the patterned mask layer equals a first angle $\theta_1$, $\theta_1 < \tan^{-1}(L/H)$;

depositing a second thin film layer on the substrate along a second direction, a second angle between the second direction and the thickness direction of the patterned mask layer equals a second angle $\theta_2$, $\theta_2 < \tan^{-1}[L/(H+D)]$, wherein the spacing distance L, the first thickness H, the second thickness D, the first angle $\theta_1$, and the second angle $\theta_2$ meet a condition of $0 < L - H\tan\theta_1 - (H+D)\tan\theta_2 < 10$ nm, the entire second area II is covered by the first thin film layer or the second thin film layer, the first thin film layer partly overlaps with the second thin film layer to form an overlapping structure and a non-overlapping structure;

removing the plurality of stripe-shaped shield;

dry etching the first thin film layer and the second thin film layer to obtain a nanoscale microstructure, wherein a first width of the nanoscale microstructure equals a second width of the overlapping structure, and the non-overlapping structure is removed by the dry etching.

2. The method as claimed in claim 1, wherein the thickness H of the photoresist mask layer is in a range of 200 nanometers to 400 nanometers.

3. The method as claimed in claim 1, wherein the spacing distance L is in a range of 200 nanometers to 450 nanometers.

4. The method as claimed in claim 1, wherein the first angle $\theta_1$ is less than or equal to 45 degrees.

5. The method as claimed in claim 1, wherein the second thickness D of the first thin film layer is less than 40 nanometers.

6. The method as claimed in claim 1, wherein the second angle $\theta_2$ is less than or equal to 45 degrees.

7. The method as claimed in claim 1, wherein an extending direction of the stripe masks is perpendicular to both the first direction and the second direction.

8. The method as claimed in claim 1, wherein the first thin film layer and the second thin film layer are not free-standing structures, part of the first thin film layer, that is located on the first area I and the second area II, is removed together with the stripe masks, and part of the second thin film layer, that is located on the first area I and the second area II, is removed together with the stripe masks.

9. The method as claimed in claim 1, wherein the first thin film layer and the second thin film layer are free-standing structures, part of the first thin film layer, that is located on the first area I and the second area II, is removed by dry etching, and part of the second thin film layer, that is located on the first area I and the second area II, is removed by dry etching.

10. A method of making thin film transistor, comprising:
locating a photoresist mask layer on a substrate, wherein a first thickness of the photoresist mask layer equals H;
forming a patterned mask layer by exposing and developing the photoresist mask layer, wherein the patterned mask layer comprises a plurality of parallel and spaced stripe-shaped shield, a spacing distance between adjacent stripe-shaped shield equals L, a top surface of the patterned mask layer away from the substrate defines a first area I, a side surface of the patterned mask layer defines a second area II, a surface of the substrate exposed between adjacent stripe-shaped shield defines a third area III;
rotating the substrate with an extending direction of the stripe-shaped shield as a rotation axis, a first angle between the substrate and the horizontal direction equals a first angle $\theta_1$, $\theta_1 < \tan^{-1}(L/H)$, depositing a first thin film layer on the substrate along the vertical direction, a second thickness of the first thin film layer equals D;
rotating the substrate back to the horizontal direction, continuing to rotate the substrate to obtain a second angle, the second angle between the substrate and the horizontal direction equals a second angle $\theta_2$, $\theta_2 < \tan^{-1}[L/(H+D)]$, depositing a second thin film layer on the substrate along the vertical direction, wherein the spacing distance L, the first thickness H, the second thickness D, the first angle $\theta_1$, and the second angle $\theta_2$ meet a condition of $0 < L - H \tan\theta_1 - (H+D)\tan\theta_2 < 10$ nm, the first thin film layer partly overlaps with the second thin film layer to form an overlapping structure and a non-overlapping structure;
removing the plurality of stripe-shaped shield;
dry etching the first thin film layer and the second thin film layer to obtain a nanoscale microstructure, wherein a first width of the nanoscale microstructure is same as a second width of the overlapping structure, and the non-overlapping structure is etched away.

11. The method as claimed in claim 10, wherein the thickness of H is in a range of 200 nanometers to 400 nanometers.

12. The method as claimed in claim 10, wherein the spacing distance is in a range of 200 nanometers to 450 nanometers.

13. The method as claimed in claim 10, wherein the first angle $\theta_1$ is less than or equal to 45 degrees.

14. The method as claimed in claim 10, wherein the second angle $\theta_2$ is less than or equal to 45 degrees.

* * * * *